(12) United States Patent
Chu et al.

(10) Patent No.: US 11,315,627 B1
(45) Date of Patent: Apr. 26, 2022

(54) VOLTAGE DROP MITIGATION TECHNIQUES FOR MEMORY DEVICES

(71) Applicant: Micron Technology, Inc., Boise, ID (US)

(72) Inventors: Wei Lu Chu, Minhang (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/950,593

(22) Filed: Nov. 17, 2020

(51) Int. Cl.
*G11C 11/4091* (2006.01)
*G11C 11/4094* (2006.01)
*G11C 11/4063* (2006.01)
*G11C 11/22* (2006.01)
*G11C 11/408* (2006.01)

(52) U.S. Cl.
CPC ...... *G11C 11/4091* (2013.01); *G11C 11/4063* (2013.01); *G11C 11/4094* (2013.01); *G11C 11/2259* (2013.01); *G11C 11/2273* (2013.01); *G11C 11/4085* (2013.01)

(58) Field of Classification Search
CPC ............ G11C 11/4091; G11C 11/2273; G11C 11/2259
See application file for complete search history.

(56) References Cited

U.S. PATENT DOCUMENTS

| | | | |
|---|---|---|---|
| 9,715,918 B1* | 7/2017 | Kawamura | G11C 11/2273 |
| 2011/0199837 A1* | 8/2011 | Reohr | G11C 8/08 365/189.06 |
| 2012/0275256 A1* | 11/2012 | Furutani | G11C 11/4076 365/207 |
| 2019/0252006 A1* | 8/2019 | Mori | G11C 5/147 |
| 2020/0211623 A1* | 7/2020 | Raad | G11C 11/4074 |
| 2021/0118482 A1* | 4/2021 | Lovett | G11C 11/221 |

\* cited by examiner

*Primary Examiner* — Mushfique Siddique
(74) *Attorney, Agent, or Firm* — Holland & Hart LLP

(57) ABSTRACT

Methods, systems, and devices for voltage drop mitigation techniques for memory devices are described. A memory device may include an array of memory cells, a conductive line, a pull-up circuit, and an output circuit. The conductive line may be configured to convey a first voltage for performing an operation with the array of memory cells. The pull-up circuit may be configured to couple the conductive line with a voltage source during at least a portion of a duration in which the operation is performed based on a first signal that enables applying a current to the array of memory cells as part of the operation. The output circuit may be configured to output a second signal to deactivate the pull-up circuit before the operation is complete. Outputting the second signal may be based on the first signal and a difference between the first voltage and a reference voltage.

20 Claims, 6 Drawing Sheets

VOLTAGE DROP MITIGATION TECHNIQUES FOR MEMORY DEVICES

FIELD OF TECHNOLOGY

The following relates generally to one or more systems for memory and more specifically to voltage drop mitigation techniques for memory devices.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
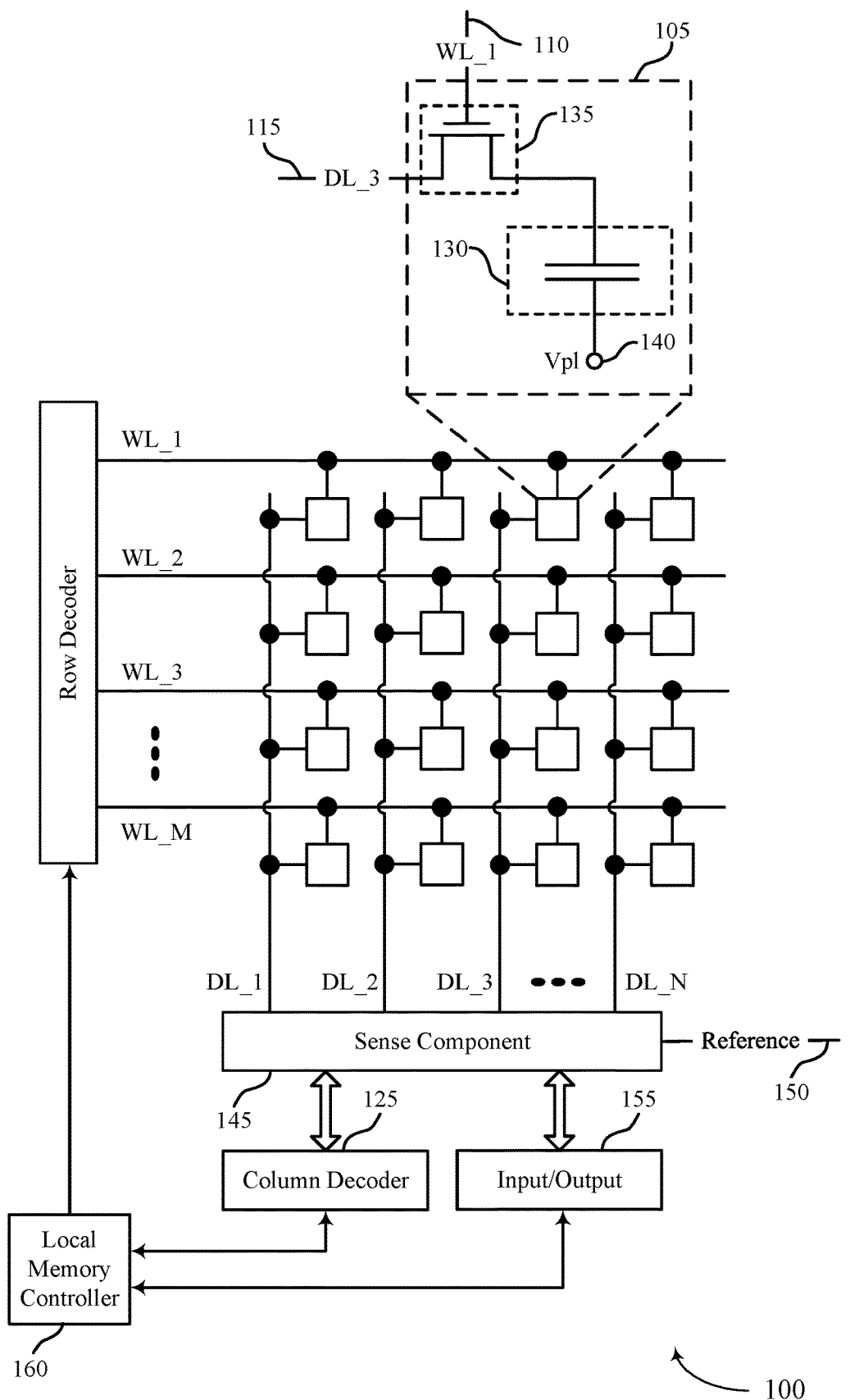
FIG. 1 illustrates an example of a memory die that supports voltage drop mitigation techniques for memory devices in accordance with examples as disclosed herein.

Some memory devices may support access operations for memory cells of a memory array. Such operations may use a first voltage associated with the memory array, which may be referred to as an array voltage (e.g., Vary). For example, a conductive line may be configured to convey the first voltage to one or more memory cells as part of a sense operation (e.g., the Vary may power sense operations, refresh operations, or both, among other examples of access operations). However, the array voltage may experience a relatively large voltage drop (e.g., a voltage drop due to package routes, large current demands, relatively poor power busses, etc.). As an illustrative example, a memory device may be configured to perform refresh operations for the memory array relatively quickly. In such examples, the memory device may apply a relatively large current through one or more memory cells in a relatively short amount of time, which may result in a relatively large voltage drop. Such relatively large voltage drops may result in sensing margin errors during the refresh operation (e.g., the memory device may fail to correctly read one or more memory cells due to a reduced sensing margin from the voltage drop).

In accordance with the techniques described herein, a memory device may implement voltage drop mitigation techniques. For example, the memory device may include a pull-up circuit configured to reduce a voltage drop for array operations, which may result in improved sensing margins, improved performance in the memory device, or both, among other benefits. The pull-up circuit may be configured couple a conductive line with a voltage source during an operation of the memory device (e.g., the memory device may perform the operation with an array of memory cells, such as a refresh operation or another access operation). In some examples, the pull-up circuit may couple the conductive line with the voltage source based on one or more inputs. For example, the pull-up circuit may receive an enable command signal (e.g., a first signal) and couple the conductive line with the voltage source based on receiving the signal.

Additionally or alternatively, the memory device may include an output circuit (e.g., a circuit including a comparator, which may be referred to as a comparator circuit), for example, coupled with the pull-up circuit. As an example, the pull-up circuit may receive a second signal from the output circuit. The output circuit may be configured to output the second signal to deactivate the pull-up circuit before the operation is complete. By deactivating the pull-up circuit before the operation is complete, the memory device may ensure that the voltage of the memory array (e.g., Vary) does not overshoot a target voltage (e.g., a default voltage of Vary), which may improve performance or reliability of the memory device, among other benefits. In some examples, the output circuit may include a comparator (e.g., a non-balanced input pair comparator) configured to output a third signal based on comparing the voltage of the memory array (e.g., Vary) to a reference signal (e.g., VaryRef). Additionally or alternatively, the output circuit may include a flip-flop circuit, one or more inverters, one or more not-AND (NAND) gates, or any combination thereof.

Features of the disclosure are initially described in the context of a system as described with reference to FIG. 1. Features of the disclosure are described in the context circuits and a timing diagram as described with reference to FIGS. 2-4. These and other features of the disclosure are further illustrated by and described with reference to an apparatus diagram and a flowchart that relate to voltage drop mitigation techniques for memory devices as described with reference to FIGS. 5 and 6.

FIG. 1 illustrates an example of a memory die 100 that supports voltage drop mitigation techniques for memory devices in accordance with examples as disclosed herein. In some examples, the memory die 100 may be referred to as a memory chip, a memory device, or an electronic memory apparatus. The memory die 100 may include one or more memory cells 105 that may each be programmable to store different logic states (e.g., programmed to one of a set of two or more possible states). For example, a memory cell 105 may be operable to store one bit of information at a time (e.g., a logic 0 or a logic 1). In some examples, a memory cell 105 (e.g., a multi-level memory cell) may be operable to store more than one bit of information at a time (e.g., a logic 00, logic 01, logic 10, a logic 11).

A memory cell 105 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 105 may include a logic storage component, such as capacitor 130, and a switching component 135. The capacitor 130 may be an example of a dielectric capacitor or a ferroelectric capacitor. A node of the capacitor 130 may be coupled with a voltage source 140, which may be the cell plate reference voltage, such as Vpl, or may be ground, such as Vss.

The memory die 100 may include one or more access lines (e.g., one or more word lines 110 and one or more digit lines 115) arranged in a pattern, such as a grid-like pattern. An access line may be a conductive line coupled with a memory cell 105 and may be used to perform access operations on the memory cell 105. In some examples, word lines 110 may be referred to as row lines. In some examples, digit lines 115 may be referred to as column lines or bit lines. References to access lines, row lines, column lines, word lines, digit lines, or bit lines, or their analogues, are interchangeable without loss of understanding or operation. Memory cells 105 may be positioned at intersections of the word lines 110 and the digit lines 115.

Operations such as reading and writing may be performed on the memory cells 105 by activating or selecting access lines such as one or more of a word line 110 or a digit line 115. By biasing a word line 110 and a digit line 115 (e.g., applying a voltage to the word line 110 or the digit line 115), a single memory cell 105 may be accessed at their intersection. The intersection of a word line 110 and a digit line 115 in either a two-dimensional or three-dimensional configuration may be referred to as an address of a memory cell 105.

Accessing the memory cells 105 may be controlled through a row decoder 120 or a column decoder 125. For example, a row decoder 120 may receive a row address from the local memory controller 160 and activate a word line 110 based on the received row address. A column decoder 125 may receive a column address from the local memory controller 160 and may activate a digit line 115 based on the received column address. In some examples, accessing the memory cells 105 may be referred to as an access operation.

Selecting or deselecting the memory cell 105 may be accomplished by activating or deactivating the switching component 135 using a word line 110. The capacitor 130 may be coupled with the digit line 115 using the switching component 135. For example, the capacitor 130 may be isolated from digit line 115 when the switching component 135 is deactivated, and the capacitor 130 may be coupled with digit line 115 when the switching component 135 is activated.

A word line 110 may be a conductive line in electronic communication with a memory cell 105 that is used to perform access operations on the memory cell 105. In some architectures, the word line 110 may be coupled with a gate of a switching component 135 of a memory cell 105 and may be operable to control the switching component 135 of the memory cell. In some architectures, the word line 110 may be coupled with a node of the capacitor of the memory cell 105 and the memory cell 105 may not include a switching component.

A digit line 115 may be a conductive line that connects the memory cell 105 with a sense component 145. In some architectures, the memory cell 105 may be selectively coupled with the digit line 115 during portions of an access operation. For example, the word line 110 and the switching component 135 of the memory cell 105 may be operable to couple and/or isolate the capacitor 130 of the memory cell 105 and the digit line 115. In some architectures, the memory cell 105 may be coupled with the digit line 115.

The sense component 145 may be operable to detect a state (e.g., a charge) stored on the capacitor 130 of the memory cell 105 and determine a logic state of the memory cell 105 based on the stored state. The sense component 145 may include one or more sense amplifiers to amplify or otherwise convert a signal resulting from accessing the memory cell 105. The sense component 145 may compare a signal detected from the memory cell 105 to a reference 150 (e.g., a reference voltage). The detected logic state of the memory cell 105 may be provided as an output of the sense component 145 (e.g., to an input/output 155), and may indicate the detected logic state to another component of a memory device that includes the memory die 100. In some examples, the sense component 145 may include a pull-up circuit or an output circuit as described herein, although such circuits may be located anywhere in the memory die 100 or outside the memory die 100.

The local memory controller 160 may control the accessing of memory cells 105 through the various components (e.g., row decoder 120, column decoder 125, sense component 145). In some examples, one or more of the row decoder 120, column decoder 125, and sense component 145 may be co-located with the local memory controller 160. The local memory controller 160 may be operable to receive one or more of commands or data from one or more different memory controllers (e.g., an external memory controller associated with a host device, another controller associated with the memory die 100), translate the commands or the data (or both) into information that can be used by the memory die 100, perform one or more operations on the memory die 100, and communicate data from the memory die 100 to a host device based on performing the one or more operations. The local memory controller 160 may generate row signals and column address signals to activate the target word line 110 and the target digit line 115. The local memory controller 160 may also generate and control various voltages or currents used during the operation of the memory die 100. In general, the amplitude, the shape, or the duration of an applied voltage or current discussed herein may be varied and may be different for the various operations discussed in operating the memory die 100.

The local memory controller 160 may be operable to perform one or more access operations on one or more memory cells 105 of the memory die 100. Examples of access operations may include a write operation, a read operation, a refresh operation, a precharge operation, or an activate operation, among others. In some examples, access operations may be performed by or otherwise coordinated by the local memory controller 160 in response to various access commands (e.g., from a host device). The local memory controller 160 may be operable to perform other access operations not listed here or other operations related to the operating of the memory die 100 that are not directly related to accessing the memory cells 105.

The local memory controller 160 may be operable to perform a write operation (e.g., a programming operation) on one or more memory cells 105 of the memory die 100. During a write operation, a memory cell 105 of the memory die 100 may be programmed to store a desired logic state. The local memory controller 160 may identify a target memory cell 105 on which to perform the write operation. The local memory controller 160 may identify a target word line 110 and a target digit line 115 coupled with the target memory cell 105 (e.g., the address of the target memory cell 105). The local memory controller 160 may activate the target word line 110 and the target digit line 115 (e.g., applying a voltage to the word line 110 or digit line 115) to access the target memory cell 105. The local memory controller 160 may apply a specific signal (e.g., write pulse) to the digit line 115 during the write operation to store a specific state (e.g., charge) in the capacitor 130 of the memory cell 105. The pulse used as part of the write operation may include one or more voltage levels over a duration.

The local memory controller 160 may be operable to perform a read operation (e.g., a sense operation) on one or more memory cells 105 of the memory die 100. During a read operation, the logic state stored in a memory cell 105 of the memory die 100 may be determined. The local memory controller 160 may identify a target memory cell 105 on which to perform the read operation. The local memory controller 160 may identify a target word line 110 and a target digit line 115 coupled with the target memory cell 105 (e.g., the address of the target memory cell 105). The local memory controller 160 may activate the target word line 110 and the target digit line 115 (e.g., applying a voltage to the word line 110 or digit line 115) to access the target memory cell 105. The target memory cell 105 may transfer a signal to the sense component 145 in response to biasing the access lines. The sense component 145 may amplify the signal. The local memory controller 160 may activate the sense component 145 (e.g., latch the sense component) and thereby compare the signal received from the memory cell 105 to the reference 150. Based on that comparison, the sense component 145 may determine a logic state that is stored on the memory cell 105.

The memory die 100 may support voltage drop mitigation techniques as described herein. For example, the local memory controller 160 may be configured to perform access operations for one or more memory cells 105 using a first voltage, which may be referred to as an array voltage (e.g., Vary) associated with the array of memory cells 105. As an illustrative example, a conductive line may be configured to convey the first voltage to one or more memory cells 105 as part of an access operation (e.g., the Vary may power read operations, refresh operations, or both, among other examples of access operations). In some examples, the local memory controller 160 may be configured to perform refresh operations for the memory cells 105 relatively quickly.

In accordance with the techniques described herein, the memory die 100 may implement voltage drop mitigation circuits. For example, the memory device may include a pull-up circuit configured to reduce a voltage drop for access operations, which may result in improved sensing margins, improved performance in the memory device, or both, among other benefits. The pull-up circuit may be configured couple a conductive line with a voltage source during an access operation (e.g., the local memory controller 160 may perform the operation with an array of memory cells 105, such as a refresh operation or another access operation).

In some examples, the pull-up circuit may couple the conductive line with the voltage source based on one or more inputs. For example, the pull-up circuit may receive an enable command signal (e.g., a first signal) and couple the conductive line with the voltage source based on receiving the signal. Additionally or alternatively, the pull-up circuit may receive a second signal from an output circuit. That is, the memory device may include the output circuit coupled with the pull-up circuit. For example, the output circuit may be configured to output the second signal to deactivate the pull-up circuit before the operation is complete. In some examples, the output circuit may include a comparator (e.g., a non-balanced input pair comparator) configured to output a third signal based on comparing the voltage of the memory array (e.g., Vary) to a reference signal (e.g., VaryRef). Additionally or alternatively, the output circuit may include a flip-flop circuit, one or more inverters, one or more NAND gates, or any combination thereof. By deactivating the pull-up circuit before the operation is complete, the memory device may ensure that the voltage of the memory array (e.g., Vary) does not overshoot a target voltage (e.g., a default voltage of Vary), which may improve performance or reliability of the memory device, among other benefits.

Figure 2:
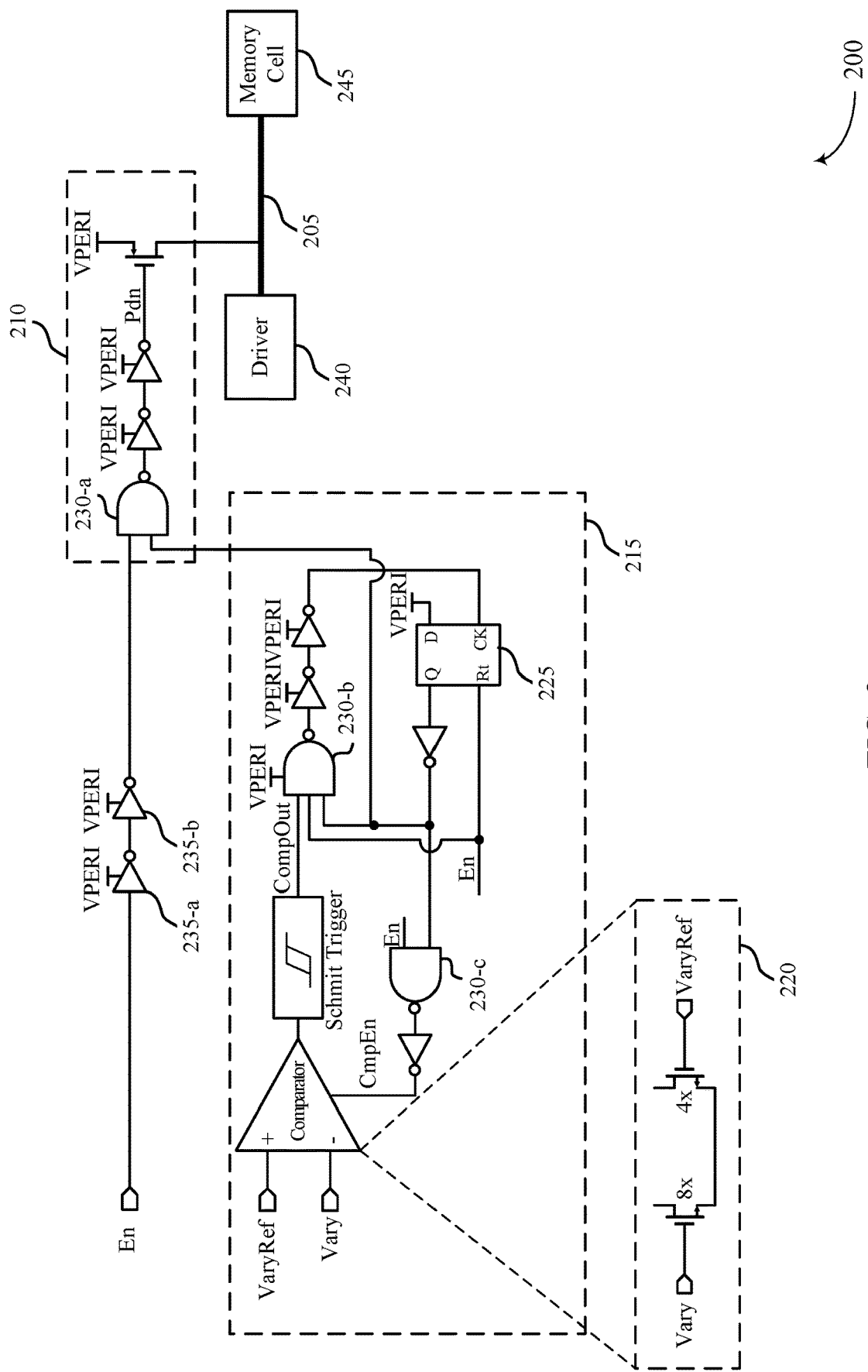
FIG. 2 illustrates an example of a circuit that supports voltage drop mitigation techniques for memory devices in accordance with examples as disclosed herein.

FIG. 2 illustrates an example of a circuit 200 that supports voltage drop mitigation techniques for memory devices in accordance with examples as disclosed herein. The circuit 200 may include a conductive line 205, a pull-up circuit 210, and an output circuit 215, which may be examples of the corresponding components as described herein with reference to FIG. 1. Generally, the circuit 200 may illustrate an example of a voltage drop mitigation circuit for access operations at a memory device.

The conductive line 205 may convey a voltage (e.g., Vary) to one or more memory cells 245 as part of one or more access operations. For example, the conductive line 205 may be an example of a voltage rail. The memory device may bias one or more access lines (e.g., digit lines, word lines) using the conductive line 205. For example, a driver 240 (e.g., an amplifier) may produce a first voltage (e.g., a Vary of, for example, 1 V, although Vary may be any voltage) and apply the first voltage to the conductive line 205. During the one or more access operations, the conductive line 205 may provide the first voltage to the access lines. For example, the conductive line may bias an access line to read a memory cell 245 (e.g., a sensing operation), write a memory cell 245, refresh a memory cell 245, or any combination thereof.

In some examples, such access operations may result in a voltage drop of the conductive line 205. For example, the operations may use a relatively high amount of current in a relatively small amount of time (e.g., a refresh operation may be performed relatively quickly for multiple memory cells, which may result in a relatively large voltage drop). In such examples, the driver 240 may be unable to maintain the first voltage of the conductive line 205 at a target voltage (e.g., a default voltage) due to the relatively large current demand. Such a voltage drop may degrade a sensing margin (e.g., if the first voltage is lower than the target voltage for a sensing operation, the accuracy or reliability of the sensing operation may be effected).

In some examples, the circuit 200 may include a capacitor configured to provide charge to the conductive line 205. For example, when the first voltage of the conductive line 205 drops below the target voltage provided by an amplifier, the capacitor may be configured to provide voltage to the conductive line 205. In some examples, the capacitor may be relatively small. For example, reducing the size of the capacitor may result in a higher density memory device.

However, a reduced size capacitor may be unable to successfully mitigate the voltage drop (e.g., due to storing less charge to supply to the conductive line 205 when a relatively large current draw occurs as part of a refresh operation).

Accordingly, the circuit 200 may additionally or alternatively include the pull-up circuit 210. The pull-up circuit 210 may be configured to mitigate the voltage drop of the conductive line 205 during one or more access operations. For example, the pull-up circuit may couple the conductive line 205 to a voltage source. The voltage source may provide a voltage or current, for example, greater than the voltage or current provided by the driver 240 (e.g., a voltage greater than the target or default voltage of the conductive line 205). In some examples, the voltage source may be a voltage source used for peripheral components of the memory array (e.g., represented as VPERI), although any voltage source may be used. In some cases, the voltage of VPERI is different than a voltage level of Vary. By coupling the conductive line 205 to the voltage source, the pull-up circuit may provide voltage to the conductive line 205 during an operation, which may reduce the voltage drop of Vary on the conductive line 205, adjust the conductive line 205 to the default or target voltage relatively quickly, or a combination thereof, among other advantages.

In some examples, the pull-up circuit 210 may include one or more inverters 235, one or more NAND gates 230, one or more transistors, or any combination thereof. For example, the pull-up circuit 210 may include a NAND gate 230-a configured to receive a first signal (e.g., an enable command signal represented by En) and a second signal (e.g., a signal output from the output circuit 215) at one or more inputs of the NAND gate 230-a. The NAND gate 230-a may output a signal based on the one or more inputs. For example, the NAND gate 230-a may send a signal to two inverters 235, which may delay the signal while maintaining the state of the signal (e.g., if the signal is high, the signal may be flipped to low after the first inverter 235 and flipped back to high after the second inverter 235). The signal may be represented by Pdn. The signal may control a transistor. For example, the signal may be sent to the gate of the transistor and the transistor may couple the voltage source VPERI to the conductive line 205, or isolate the voltage source VPERI and the conductive line 205, based on a value of the signal Pdn (e.g., if Pdn is low current may pass through the transistor, if Pdn is high current may be unable to pass through the transistor).

Additionally or alternatively, the circuit 200 may include an output circuit 215. The output circuit 215 may be coupled to the pull-up circuit 210. For example, the output circuit 215 may output the second signal to the input of the NAND gate 230-a of the pull-up circuit 210. The output circuit 215 may regulate the pull-up circuit 210 using the second signal. For example, the output circuit 215 may send the second signal that enables the pull-up circuit to couple the conductive line 205 to the voltage source (e.g., provide a voltage "shot" to Vary), or the second signal may deactivate the pull-up circuit 210 (e.g., the second signal may cause the transistor of the pull-up circuit 210 to isolate the conductive line 205 from the voltage source before an end of an operation, which may prevent an overshoot). In some cases, overshoot in the voltage on the conductive line may reduce the sensing margin associated with reading memory cells, among other effects of overshoot. Overshoot may refer to when a voltage level on the conductive line 205 goes above an upper voltage threshold for normal operation of the memory cells.

The output circuit 215 may include one or more comparators 220, one or more Schmit trigger components, one or more NAND gates 230, one or more inverters 235, one or more flip-flop circuits 225, or any combination thereof. For example, the output circuit 215 may include the comparator 220. The comparator 220 may be configured to receive at least two inputs, compare the inputs, and output a signal (e.g., a third signal) based on the comparison. For example, the comparator may be configured to compare the first voltage of the conductive line 205 (e.g., Vary) to a reference voltage (e.g., VaryRef), which may be an example of a target or default voltage of the conductive line 205. In some examples, if the difference between the inputs satisfies a threshold, the comparator may output a signal indicating the satisfied threshold. As an example, if the difference between Vary and VaryRef satisfies a threshold (e.g., is greater than a threshold or the comparator 220 detects a different between the two inputs), the comparator 220 may output a high signal. In some examples, the comparator 220 may be an example of a non-balanced input pair comparator. As shown for illustrative clarity, the Vary input may be associated with an 8 devices and the VaryRef may be associated with 4 devices, although any quantity of devices may be used. The difference between the quantity of devices may adjust a threshold (e.g., with 8 devices for Vary and 4 devices for sensing VaryRef, the comparator may output a high signal if the Vary is 30 mV less than the VaryRef, as an example). Thus, the threshold may be configurable by implementing various quantities of sensing devices for each input. The imbalanced comparator may be configured to compare the voltage level of Vary to a VaryRef and a delta voltage. In such cases, the pull-up circuit 210 may couple the conductive line 205 with the voltage source (e.g., Vperi) when the enable signal is received and the output circuit 215 may cause the pull-up circuit 210 to isolate the conductive line 205 from the voltage source (e.g., Vperi) when the voltage level of the conductive line 205 equals the VaryRef minus the delta voltage (e.g., caused by the imbalanced comparator). The imbalance of the comparator may be tuned to different values based on the desired delta voltage between Vary and VaryRef.

The output circuit 215 may include a Schmit trigger. In some examples, the Schmit trigger may be a part of the comparator 220 or the Schmit trigger may be a separate component as shown for illustrative clarity. The Schmit trigger may be configured to convert an output of the comparator 220 from an analog output to a digital output. For example, if the comparator outputs a signal CompOut indicating that a difference between the first voltage (e.g., Vary) and the reference voltage (e.g., VaryRef) satisfy a threshold, the Schmit trigger may output a high signal (e.g., 1).

The output circuit 215 may include one or more inverters 235, which may flip a received signal state to an opposite or different state (e.g., a 0 received at an inverter may be output as a 1, and vice versa). Such inverters 235 may additionally or alternatively be used to delay signal propagation in the circuit 200 (e.g., two inverters may delay a delivery of the signal while maintaining the signal as high or low). The output circuit 215 may include one or more NAND gates 230. A NAND gate 230 may be configured to output a signal based on one or more inputs. For example, a NAND gate 230 may output a low signal (e.g., 0) if some or all of the inputs are high (e.g., 1), or output a high signal if one or more of the inputs are low.

The output circuit may include a flip-flop circuit 225. The flip-flop circuit 225 may be configured to output the second signal to deactivate the pull-up circuit 210 based on receiving one or more inputs as described herein. The flip-flop circuit may include a data sampling node (e.g., D), a clock input node (e.g., CK), a reset node (e.g., Rt), and an output node (e.g., Q). In some examples, the flip-flop circuit 225 may be an example of a rising edge flip-flop (e.g., if the CK node receives a signal that transitions from 1 to 0, which may be referred to as a falling edge, the output of the flip-flop circuit 225 may remain relatively the same. If the CK node receives a signal that transitions from 0 to 1, which may be referred to as a rising edge, the CK node may sample the data at node D (e.g., which may be coupled with the voltage source VPERI and may result in a high sample of 1), which may change an output of the flip-flop circuit 225. In some examples, the enable signal (e.g., En) may be used to reset the flip-flop circuit 225 to ensure a relatively small impact during a disable of an active amplifier for the conductive line 205.

As an illustrative example of an access operation implementing the circuit 200, the memory device may initiate an operation. For example, the memory device may start a refresh operations, among other examples of access operations. The memory device may transmit an enable command signal (e.g., EN) based on initiating the operation. For example, the memory device may adjust the EN signal from a low value (e.g., 0) to a high value (e.g., 1) based on initiating the operation (e.g., the memory device may pulse the EN signal from 0 to 1 for a relatively short time period to enable the pull-up circuit 210 in advance, during, or subsequent to the operation). The EN signal may be conveyed to an input of one or more components, which may result in activating the transistor of the pull-up circuit 210 and coupling the conductive line 205 with the voltage source VPERI (e.g., providing a voltage shot to the conductive line to mitigate a voltage drop from the operation). For example, the EN signal may be input to the NAND gate 230-*a* (e.g., after a delay in time from the signal passing through the two inverters 235-*a* and 235-*b*). The EN signal may be input to the NAND gates 230-*b* and 230-*c*. The EN signal may be input to the RT node of the flip-flop circuit 225, which may reset the flip-flop circuit 225.

Upon conveying the enable signal command, the output circuit 215 may output a second signal to the input of the NAND gate 230-*a*. Initially, the second signal may be high, which may result in the Pdn signal being low. The low Pdn signal coupled to the gate of the transistor of the pull-up circuit 210 may couple the voltage source VPERI to the conductive line 205 to apply a relatively high voltage to the line, which may facilitate relatively fast operations while ensuring the voltage drop is mitigated and sense margins are maintained.

The output circuit 215 may be configured to enable the coupling of the conductive line 205 to the voltage source when the enable signal command is received. For example, the enable signal may reset the rising edge flip-flop circuit 225. Thus, when the comparator 220 outputs CompOut with a value indicating that the difference between VaryRef and Vary satisfies a threshold (e.g., due to the first voltage drop associated with the operation), the signal output from the flip-flop circuit 225 may be relatively unchanged (e.g., the signal to the CK node may go from 1 to 0, which may be referred to as a falling edge and may not trigger the D node to sample the data).

The conductive line 205 may be coupled to the voltage source VPERI for a period of time. For example, the voltage Vary may begin to rise due to the coupling until the difference between Vary and VaryRef fails to satisfy the threshold at a second time. For example, the voltage may rise until the difference between Vary and VaryRef is less than or equal to 30 mV, among other examples of thresholds. In such examples, the comparator 220 and/or the Schmit trigger may adjust the output signal CompOut from high to low (e.g., from 1 to 0). The NAND gate 230-*b* may then change an output from low to high (e.g., due to one or more of the inputs of the NAND gate 230-*b* being low). In other words, the input to the flip-flop circuit 225 at the CK node may go from being 0 to 1, which may be referred to as a rising edge. The rising edge may trigger the D node to sample the data of VPERI (e.g., 1), which may change an output of the flip-flop circuit from low to high. The output may be inverted and conveyed to an input of the NAND gate 230-*a*, 230-*c*, 230-*b*, or a combination thereof. In other words, the second signal output from the output circuit 215 may be low, which may deactivate the pull-up circuit 210 (e.g., the NAND gate 230-*a* may receive the low output, which may change the Pdn signal to high and disable the transistor of the pull-up circuit 210). The NAND gate 230-*b* may receive the low signal from the inverted output of the flip-flop circuit 225 and output an inverted CmpEN signal, which may disable the comparator 220 (e.g., if CmpEN is low or zero, the CompOut may output low or zero).

Thus, the output circuit 215 may be configured to deactivate the pull-up circuit 210 when the difference between the first voltage and the reference voltage satisfies a threshold (e.g., VPERI may be isolated from the conductive line 205 when Vary is 30 mV less than the target or default voltage represented by the reference voltage VaryRef). An amplifier of the conductive line 205 may drive the voltage Vary the remaining difference until Vary reaches the target or default voltage (e.g., the amplifier may be relatively unlikely to overshoot the voltage of the conductive line 205 above a target voltage compared to the relatively high voltage source VPERI).

Figure 3:
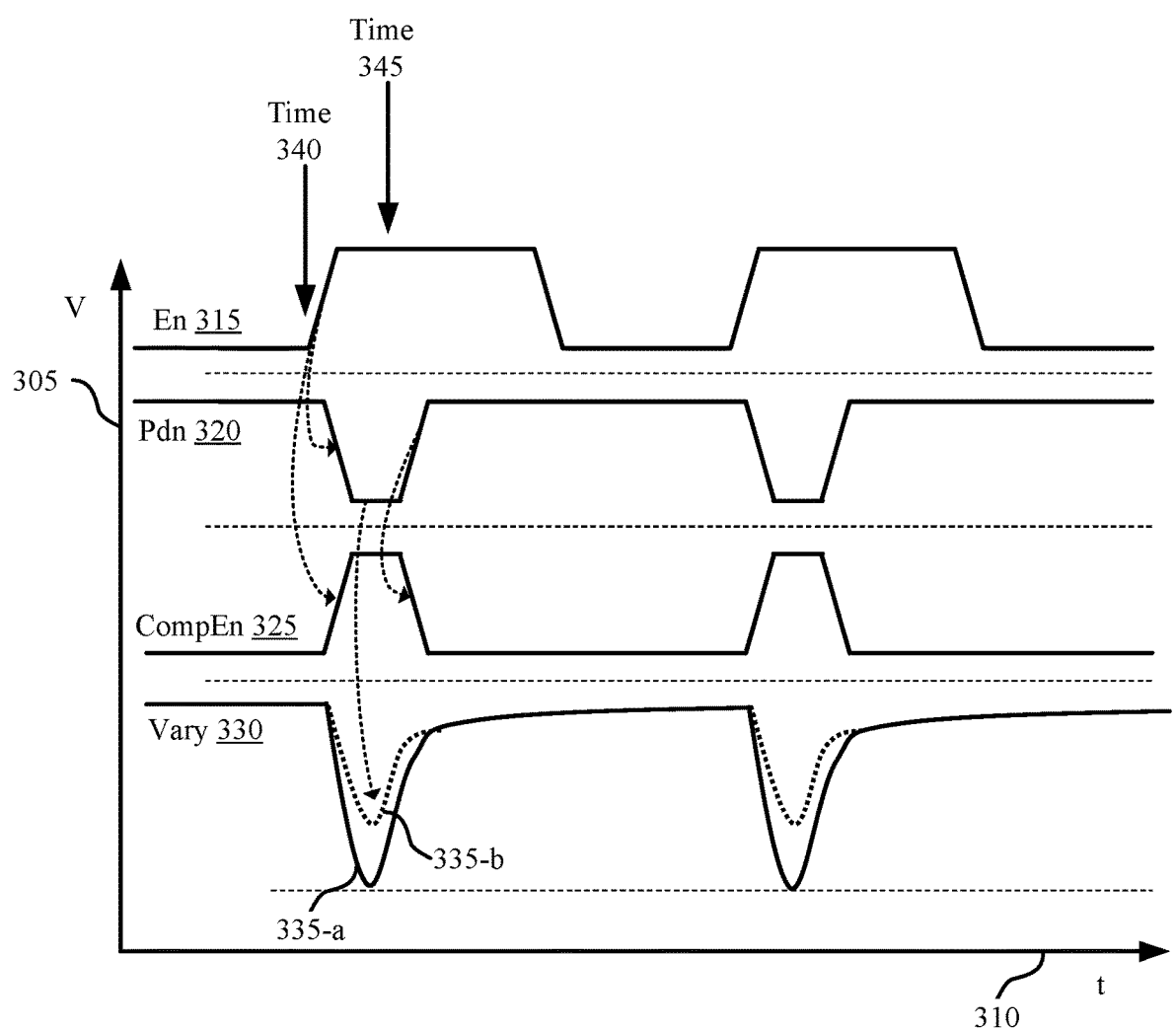
FIG. 3 illustrates an example of a timing diagram that supports voltage drop mitigation techniques for memory devices in accordance with examples as disclosed herein.

FIG. 3 illustrates an example of a timing diagram 300 that supports voltage drop mitigation techniques for memory devices in accordance with examples as disclosed herein. Generally, the timing diagram 300 may illustrate an example operations implementing a pull-up circuit and/or an output circuit as described herein with reference to FIG. 2. For example, the timing diagram 300 may include a voltage axis 305 and a time axis 310. The timing diagram 300 may show the signals En 315, Pdn 320, CompEn 325, and Vary 330, which may be examples of the signals described with reference to FIG. 2. Although shown as separate voltages for illustrative clarity, the voltage levels of each signal may be located anywhere on the timing diagram 300, may be examples of current signals, or any combination thereof.

At or near time 340, a memory device may initiate an operation. For example, the memory device may begin a refresh operation, among other examples of access operations. Such an operation may result in a voltage drop of the first voltage associated with an array of memory cells, e.g., Vary 330. As illustrated, Vary 330 may begin to drop due to a current demand of the operation as described herein with reference to FIG. 2.

The memory device may send an enable command signal pulse at time 340. For example, the memory device may bring the En 315 signal high at 335 as described with reference to FIG. 2. Bringing the En 315 signal high may result in the Pdn 320 signal going low and the CompEn 325 signal going high, as described with reference to FIG. 2. When the Pdn 320 signal goes low, a voltage source may be coupled with a conductive line via a pull-up circuit (e.g., a transistor in the pull-up circuit may be activated), which may alter the level of Vary 330. For example, level 335-*a* may be an example of the voltage drop without the coupling of the voltage source to the conductive line, and level 335-*b* may be an example of the voltage drop occuring due to the Pdn 320 signal going low and coupling the voltage source with the conductive line.

At time 345, the output circuit may output a second signal to deactivate the pull-up circuit. For example, a comparator of the output circuit may determine that a difference between Vary 330 and a reference voltage satisfies a threshold at time 345. The output circuit may deactivate the pull-up circuit as described with reference to FIG. 2 (e.g., the conductive line may be isolated from the voltage source). For example, the output of a comparator of the output circuit may cause a clock input of a flip-flop to change values, thereby changing the output of the flip-flop, which may result in the Pdn 320 signal going high at 345 and the CompEn 325 going low at 345. After the initial spike in current demand, the level 335-*a* recovers to the nominal voltage level for the conductive line. The level 335-*b* shows how using the techniques and devices described herein the level 335-*b* converges more quickly to the target or default voltage for Vary 330 than the level 335-*a* and experiences a less severe voltage drop. Accordingly, the memory device may reduce a voltage drop while implementing relatively fast operations (e.g., using a relatively large current), among other advantages. Reducing the voltage drop (e.g., increasing the voltage level during the current demand) and improving the response time (e.g., reducing the time it takes to recover to a target voltage level) may cause the components of the memory to operate at a more normal level and my reduce how much the sense margin reduces during the operation. In some cases, the techniques described herein may be used for any operation that experiences spikes in current demand. In some cases, these techniques may be used during an automatic refresh (AREF) operation.

Figure 4:
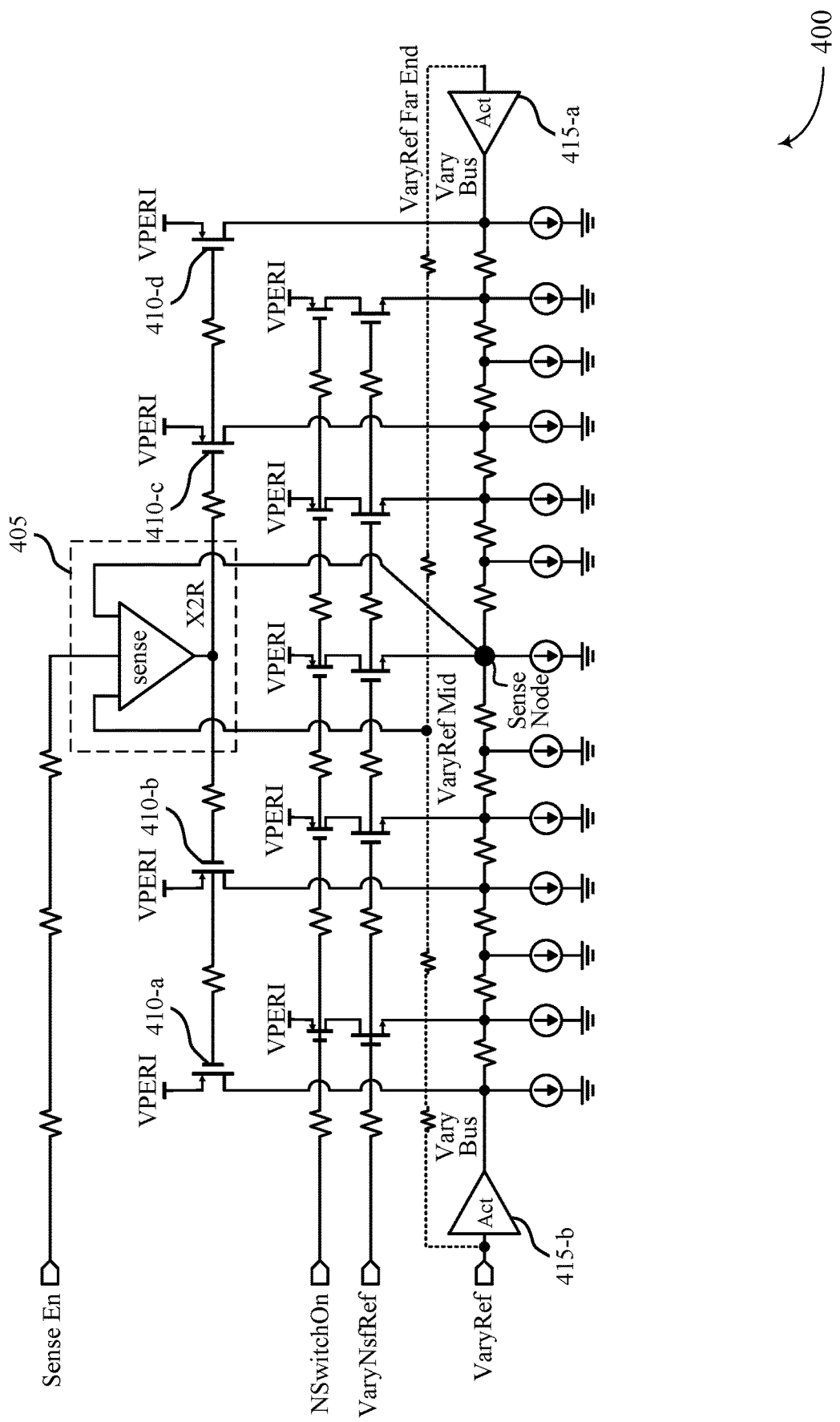
FIG. 4 illustrates an example of a circuit that supports voltage drop mitigation techniques for memory devices in accordance with examples as disclosed herein.

FIG. 4 illustrates an example of a circuit 400 that supports voltage drop mitigation techniques for memory devices in accordance with examples as disclosed herein. The circuit 400 illustrates an example of a sense component 405 implementing voltage drop mitigation techniques as described herein. For example, the sense component 405 may be an example of the circuit 200 described with reference to FIG. 2 and may include one or more aspects of a pull-up circuit, an output circuit, or any combination thereof. The circuit 400 may illustrate how the sense component 405 relates to other components of a memory array more generally.

The circuit 400 may illustrate an example of multiple pull-up devices 410 (e.g., transistors of one or more pull-up circuits) distributed in the memory device. For example, the circuit 400 may illustrate 4 pull-up devices 410 distributed equally and coupled with the sense component 405, although any quantity of configuration of the pull-up devices 410 may be used. Additionally or alternatively, the circuit 400 may include one or more active amplifiers 415. The pull-up devices 410, the active amplifiers 415, or any combination thereof may pull-up the first voltage of a conductive line (e.g., apply one or more voltages to the Vary bus to obtain a target or default voltage during an operation) as described herein with reference to FIG. 2.

Figure 5:
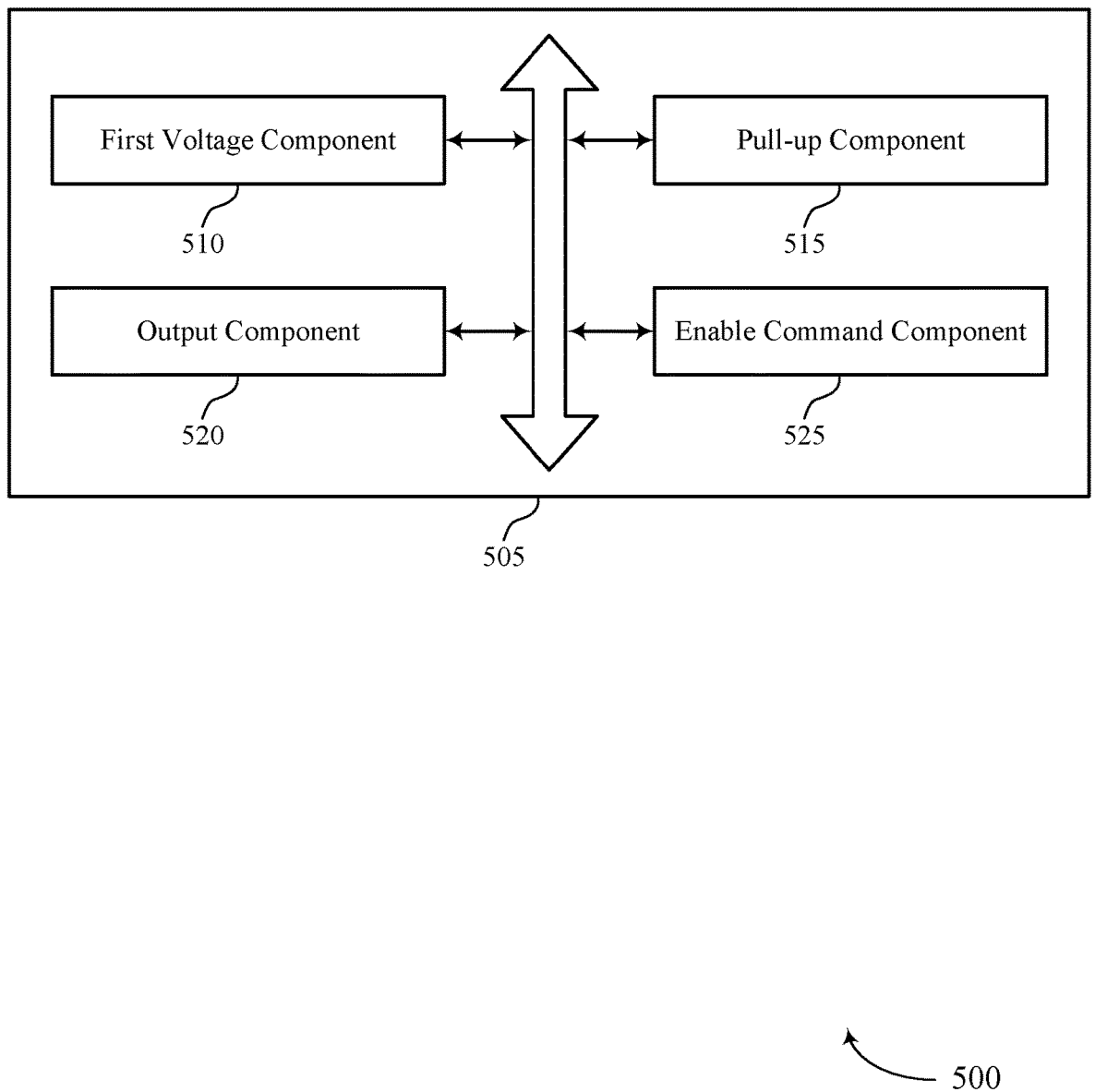
FIG. 5 shows a block diagram of a memory device that supports voltage drop mitigation techniques for memory devices in accordance with examples as disclosed herein.

FIG. 5 shows a block diagram 500 of a memory device 505 that supports voltage drop mitigation techniques for memory devices in accordance with examples as disclosed herein. The memory device 505 may be an example of aspects of a memory device as described with reference to FIGS. 1-4. The memory device 505 may include a first voltage component 510, a pull-up component 515, an output component 520, and an enable command component 525. Each of these modules may communicate, directly or indirectly, with one another (e.g., via one or more buses).

The first voltage component 510 may apply a first voltage to a conductive line coupled with an array of memory cells as part of performing an operation with the array of memory cells.

The pull-up component 515 may couple, using a pull-up circuit, the conductive line with a voltage source based on applying the first voltage. In some examples, the pull-up component 515 may isolate, using the pull-up circuit, the conductive line from the voltage source before the operation is complete based on identifying that the difference satisfies the threshold. In some examples, the pull-up component 515 may receive, at the pull-up circuit, one or more inputs, where coupling the conductive line with the voltage source is based on receiving the one or more inputs. In some cases, the one or more inputs include a first signal enabling the pull-up circuit, a second signal output from the output circuit, or a combination thereof. In some cases, the pull-up circuit includes a first transistor, a NAND gate, one or more inverters, or any combination thereof.

The output component 520 may identify, using an output circuit, that a difference between the first voltage on the conductive line and a reference voltage satisfies a threshold. In some cases, the output circuit includes a comparator component, a flip-flop component, one or more inverters, one or more NAND gates, or any combination thereof.

The enable command component 525 may transmit, to the pull-up circuit, the output circuit, or both, an enable command as part of performing the operation with the array of memory cells, where coupling the conductive line with the voltage source is based on the enable command.

Figure 6:
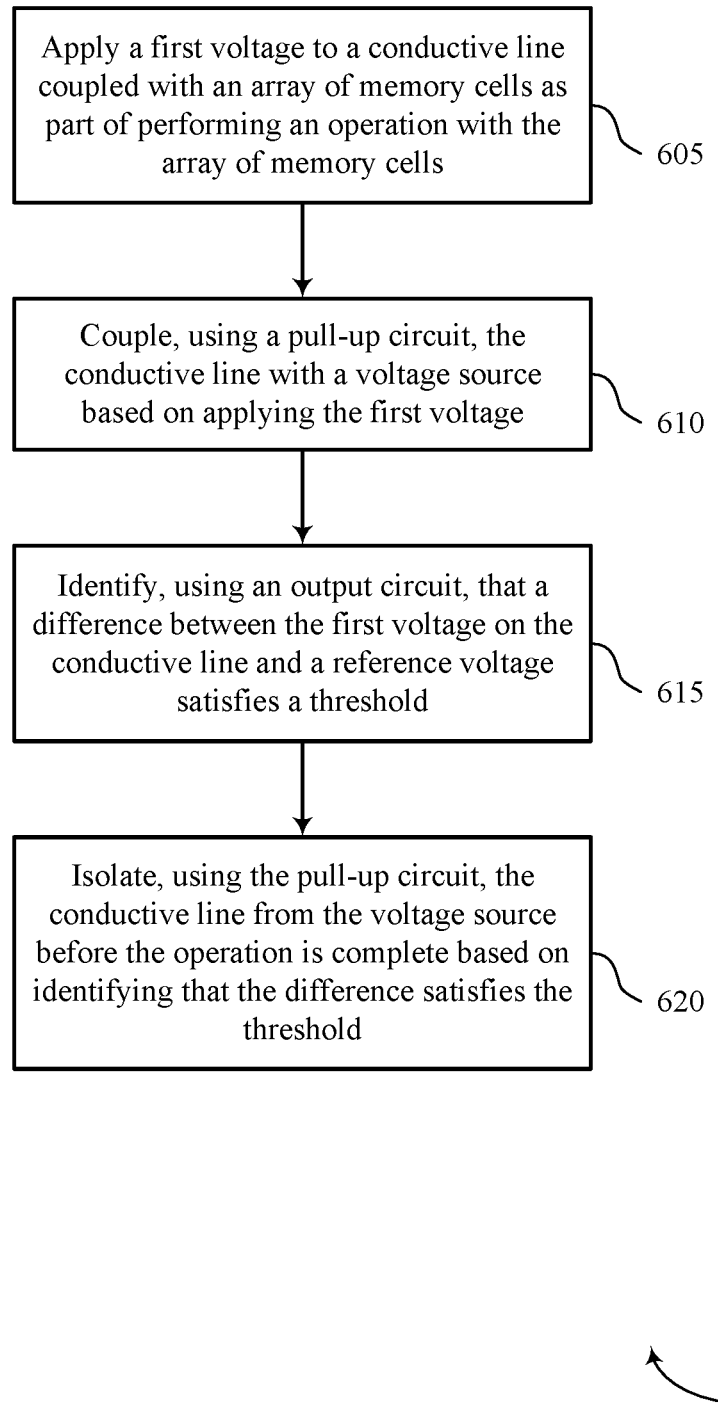
FIG. 6 shows a flowchart illustrating a method or methods that support voltage drop mitigation techniques for memory devices in accordance with examples as disclosed herein.

FIG. 6 shows a flowchart illustrating a method or methods 600 that supports voltage drop mitigation techniques for memory devices in accordance with examples as disclosed herein. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may apply a first voltage to a conductive line coupled with an array of memory cells as part of performing an operation with the array of memory cells. The operations of 605 may be performed according to the methods described herein. In some examples, aspects of the operations of 605 may be performed by a first voltage component as described with reference to FIG. 5.

At 610, the memory device may couple, using a pull-up circuit, the conductive line with a voltage source based on applying the first voltage. The operations of 610 may be performed according to the methods described herein. In some examples, aspects of the operations of 610 may be performed by a pull-up component as described with reference to FIG. 5.

At 615, the memory device may identify, using an output circuit, that a difference between the first voltage on the conductive line and a reference voltage satisfies a threshold. The operations of 615 may be performed according to the methods described herein. In some examples, aspects of the operations of 615 may be performed by an output component as described with reference to FIG. 5.

At 620, the memory device may isolate, using the pull-up circuit, the conductive line from the voltage source before the operation is complete based on identifying that the difference satisfies the threshold. The operations of 620 may be performed according to the methods described herein. In some examples, aspects of the operations of 620 may be performed by a pull-up component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for applying a first voltage to a conductive line coupled with an array of memory cells as part of performing an operation with the array of memory cells, coupling, using a pull-up circuit, the conductive line with a voltage source based on applying the first voltage, identifying, using an output circuit, that a difference between the first voltage on the conductive line and a reference voltage satisfies a threshold, and isolating, using the pull-up circuit, the conductive line from the voltage source before the operation is complete based on identifying that the difference satisfies the threshold.

Some examples of the method 600 and the apparatus described herein may further include operations, features, means, or instructions for receiving, at the pull-up circuit, one or more inputs, where coupling the conductive line with the voltage source may be based on receiving the one or more inputs.

In some examples of the method 600 and the apparatus described herein, the one or more inputs include a first signal enabling the pull-up circuit, a second signal output from the output circuit, or a combination thereof.

Some examples of the method 600 and the apparatus described herein may further include operations, features, means, or instructions for transmitting, to the pull-up circuit, the output circuit, or both, an enable command as part of performing the operation with the array of memory cells, where coupling the conductive line with the voltage source may be based on the enable command.

In some examples of the method 600 and the apparatus described herein, the output circuit includes a comparator component, a flip-flop component, one or more inverters, one or more NAND gates, or any combination thereof.

In some examples of the method 600 and the apparatus described herein, the pull-up circuit includes a first transistor, a NAND gate, one or more inverters, or any combination thereof.

It should be noted that the methods described herein describe possible implementations, and that the operations and the steps may be rearranged or otherwise modified and that other implementations are possible. Further, portions from two or more of the methods may be combined.

An apparatus is described. The apparatus may include an array of memory cells, a conductive line configured to convey a first voltage for performing an operation with the array of memory cells, a pull-up circuit configured to couple the conductive line with a voltage source during at least a portion of a duration in which the operation is performed based on a first signal that enables applying a current to the array of memory cells as part of the operation, and an output circuit configured to output a second signal to deactivate the pull-up circuit before the operation is complete, where outputting the second signal is based on the first signal and a difference between the first voltage and a reference voltage.

In some examples, the output circuit may be configured to receive one or more inputs including the first signal, the first voltage, the reference voltage, or a combination thereof.

In some examples, the output circuit may include operations, features, means, or instructions for receive the first voltage and the reference voltage, and output a third signal based on the difference between the first voltage and the reference voltage satisfying a threshold, where outputting the second signal may be based on outputting the third signal.

In some examples, the output circuit may include operations, features, means, or instructions for receive the third signal from the comparator, and output the second signal to the pull-up circuit based on receiving the third signal.

In some examples, the comparator may be disabled based on the flip-flop circuit outputting the second signal.

In some examples, the flip-flop circuit includes a rising edge flip-flop circuit.

In some examples, the output circuit includes one or more inverters, NAND gates, or any combination thereof.

In some examples, the output circuit includes a non-balanced comparator.

In some examples, the pull-up circuit may be activated based on one or more inputs include the first signal that enables applying the current to the array of memory cells and the second signal output from the output circuit.

In some examples, the pull-up circuit includes a first transistor, a NAND gate, one or more inverters, or any combination thereof.

Some examples may further include receiving the first signal and the second signal, and output a third signal to a gate of the first transistor, where the first transistor may be configured to selectively couple the conductive line with the voltage source based on a value of the third signal.

In some examples, the first signal includes an enable command signal.

An apparatus is described. The apparatus may include an array of memory cells, an output circuit, a pull-up circuit, and a controller coupled with the array of memory cells and configured to cause the apparatus to apply a first voltage to a conductive line coupled with the array of memory cells as part of performing an operation with the array of memory cells, couple, using the pull-up circuit, the conductive line with a voltage source based on applying the first voltage, identify, using the output circuit, that a difference between the first voltage on the conductive line and a reference voltage satisfies a threshold, and isolate, using the pull-up circuit, the conductive line from the voltage source before the operation is complete based on identifying that the difference satisfies the threshold.

In some examples, the output circuit includes a comparator component, a flip-flop component, one or more inverters, one or more NAND gates, or any combination thereof, and where the pull-up circuit includes a first transistor, a NAND gate, one or more inverters, or any combination thereof.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   an array of memory cells;
   a conductive line configured to convey a first voltage for performing an operation with the array of memory cells;
   a pull-up circuit configured to couple the conductive line with a voltage source during at least a portion of a duration in which the operation is performed based at least in part on a first signal that enables applying a current to the array of memory cells as part of the operation; and
   an output circuit configured to output a second signal to deactivate the pull-up circuit before the operation is complete, wherein outputting the second signal is based at least in part on the first signal and a difference between the first voltage and a reference voltage, wherein the pull-up circuit is deactivated based at least in part on inputting both the second signal and the first signal to the pull-up circuit.

2. The apparatus of claim 1, wherein the output circuit is configured to receive one or more inputs comprising the first signal, the first voltage, the reference voltage, or a combination thereof.

3. The apparatus of claim 1, wherein the output circuit comprises a comparator configured to:
   receive the first voltage and the reference voltage; and
   output a third signal based at least in part on the difference between the first voltage and the reference voltage satisfying a threshold, wherein outputting the second signal is based at least in part on outputting the third signal.

4. The apparatus of claim 1, wherein the output circuit comprises a flip-flop circuit configured to:
   receive a third signal from a comparator; and
   output the second signal to deactivate the pull-up circuit based at least in part on receiving the third signal output from the comparator.

5. The apparatus of claim 4, wherein the comparator is disabled based at least in part on the flip-flop circuit outputting the second signal.

6. The apparatus of claim 4, wherein the flip-flop circuit comprises a rising edge flip-flop circuit.

7. The apparatus of claim 4, wherein the output circuit comprises one or more inverters, NAND gates, or any combination thereof.

8. The apparatus of claim 1, wherein the output circuit comprises a non-balanced comparator.

9. The apparatus of claim 1, wherein the pull-up circuit is activated based at least in part on one or more inputs comprising the first signal that enables applying the current to the array of memory cells and the second signal output from the output circuit.

10. The apparatus of claim 1, wherein the pull-up circuit comprises a first transistor, a not-and (NAND) gate, one or more inverters, or any combination thereof.

11. The apparatus of claim 10, wherein the NAND gate is configured to:
    receive the first signal and the second signal; and
    output a third signal to a gate of the first transistor, wherein the first transistor is configured to selectively couple the conductive line with the voltage source based at least in part on a value of the third signal.

12. The apparatus of claim 1, wherein the first signal comprises an enable command signal.

13. A method for operations at a memory device, comprising:
    applying a first voltage to a conductive line coupled with an array of memory cells as part of performing an operation with the array of memory cells;
    coupling, using a pull-up circuit, the conductive line with a voltage source based at least in part on applying the first voltage;
    identifying, using an output circuit, that a difference between the first voltage on the conductive line and a reference voltage satisfies a threshold; and
    isolating, using the pull-up circuit, the conductive line from the voltage source before the operation is complete based at least in part on identifying that the difference satisfies the threshold, wherein isolating the conductive line from the voltage source is based at least in part on inputting, to the pull-up circuit, both a first signal enabling the pull-up circuit and a second signal output from the output circuit.

14. The method of claim 13, further comprising:
receiving, at the pull-up circuit, one or more inputs, wherein coupling the conductive line with the voltage source is based at least in part on receiving the one or more inputs.

15. The method of claim 14, wherein the one or more inputs comprise the first signal enabling the pull-up circuit, the second signal output from the output circuit, or a combination thereof.

16. The method of claim 13, further comprising:
transmitting, to the pull-up circuit, the output circuit, or both, an enable command as part of performing the operation with the array of memory cells, wherein coupling the conductive line with the voltage source is based at least in part on the enable command.

17. The method of claim 13, wherein the output circuit comprises a comparator component, a flip-flop component, one or more inverters, one or more not-AND (NAND) gates, or any combination thereof.

18. The method of claim 13, wherein the pull-up circuit comprises a first transistor, a not-and (NAND) gate, one or more inverters, or any combination thereof.

19. An apparatus, comprising:
an array of memory cells,
an output circuit,
a pull-up circuit, and
a controller coupled with the array of memory cells and configured to cause the apparatus to:
apply a first voltage to a conductive line coupled with the array of memory cells as part of performing an operation with the array of memory cells;
couple, using the pull-up circuit, the conductive line with a voltage source based at least in part on applying the first voltage;
identify, using the output circuit, that a difference between the first voltage on the conductive line and a reference voltage satisfies a threshold; and
isolate, using the pull-up circuit, the conductive line from the voltage source before the operation is complete based at least in part on identifying that the difference satisfies the threshold, wherein isolating the conductive line from the voltage source is based at least in part on inputting, to the pull-up circuit, both a first signal enabling the pull-up circuit and a second signal output from the output circuit.

20. The apparatus of claim 19, wherein:
the output circuit comprises a comparator component, a flip-flop component, a first set of one or more inverters, one or more not-AND (NAND) gates, or any combination thereof; and
the pull-up circuit comprises a first transistor, a not-and (NAND) gate, a second set of one or more inverters, or any combination thereof.

\* \* \* \* \*